(12) United States Patent
Lin et al.

(10) Patent No.: US 8,751,995 B1
(45) Date of Patent: Jun. 10, 2014

(54) METHOD OF COMMON-CENTROID IC LAYOUT GENERATION

(71) Applicant: National Chung Cheng University, Chia-Yi County (TW)

(72) Inventors: Po-Hung Lin, Hsinchu (TW); Yi-Ting He, Daxi Township, Taoyuan County (TW); Wei-Hao Hsiao, Tainan (TW)

(73) Assignee: National Chung Cheng University, Chia-Yi County (TW)

( * ) Notice: Subject to any disclaimer, the term of this patent is extended or adjusted under 35 U.S.C. 154(b) by 0 days.

(21) Appl. No.: 13/919,548

(22) Filed: Jun. 17, 2013

(51) Int. Cl.
*G06F 17/50* (2006.01)

(52) U.S. Cl.
USPC ............ 716/126; 716/118; 716/119; 716/123

(58) Field of Classification Search
CPC .............. H01L 23/528; H01L 27/0203; H01L 27/0211; H01L 2224/16225; H01L 22/20; H01L 23/147; H01L 27/0207
USPC .................................. 716/118, 119, 123, 126
See application file for complete search history.

(56) References Cited

U.S. PATENT DOCUMENTS

| | | | |
|---|---|---|---|
| 7,128,270 B2 * | 10/2006 | Silverbrook et al. | .... 235/472.01 |
| 7,403,147 B2 | 7/2008 | Klaassen | |
| 7,450,551 B2 | 11/2008 | Lim et al. | |
| 7,639,905 B2 | 12/2009 | Ikeda et al. | |
| 7,992,117 B2 | 8/2011 | Bowen | |
| 2006/0026547 A1 * | 2/2006 | Aggarwal | ........................ 716/16 |
| 2007/0294652 A1 * | 12/2007 | Bowen | ............................. 716/10 |
| 2013/0105938 A1 * | 5/2013 | Cheng | ............................ 257/528 |

* cited by examiner

*Primary Examiner* — Vuthe Siek
*Assistant Examiner* — Brian Ngo
(74) *Attorney, Agent, or Firm* — Muncy, Geissler, Olds & Lowe, P.C.

(57) ABSTRACT

A method of common-centroid IC layout generation includes the following steps of acquiring a netlist of one circuit-element set; summing up the numbers of the unit element of all elements of the circuit-element set to get the total number of the unit elements and then determine the unit element array, the aspect ratio of which is closest to 1, via a combination operation; generating multiple common-centroid placements according to the unit element array and applying global routing assignment to each of the common-centroid placements; proceeding with cost evaluation in such a way that a cost calculation is applied to each of the common-centroid placements to get a corresponsive value; and comparing all of the common-centroid placements according to the values got from the cost evaluation and selecting the common-centroid placement corresponding to one of the values according to a predetermined condition for detailed routing.

10 Claims, 3 Drawing Sheets

METHOD OF COMMON-CENTROID IC LAYOUT GENERATION

BACKGROUND OF THE INVENTION

1. Field of the Invention

The present invention relates generally to a method of an IC layout and more particularly, to a method of common-centroid IC layout generation.

2. Description of the Related Art

In the analogous layout design, ratioed capacitors are frequently applied. The accuracy of capacitance ratios correlates closely with the matching properties among the ratioed capacitors and the induced parasitics resulting from interconnecting wires. However, most of previous works only emphasized the matching quality of a common-centroid placement but ignored the induced parasitics after it is routed.

U.S. Pat. No. 7,403,147 disclosed a capacitor array having an individual shielded unit capacitor and emphasized the common-centroid approach. However, it did not propose any solution to the induced parasitics after the wires are routed.

U.S. Pat. No. 7,992,117 disclosed a common-centroid layout and did not propose any solution to the induced parasitics after the routing is completed.

SUMMARY OF THE INVENTION

The primary objective of the present invention is to provide a method of common-centroid IC layout generation, which can effectively reduce area, wirelength, and routing-induced parasitics and guarantee the best matching quality to further maintain the accuracy of the capacitance ratios after the routing is completed.

The foregoing objectives of the present invention are attained by the method having the following steps of acquiring a netlist of one circuit-element set, the netlist at least having the number of the unit element corresponding to each element of the circuit-element set; summing up the numbers of the unit element of all elements of the circuit-element set to get the total number of the unit elements and then determine the unit element array, the aspect ratio of which is closest to 1, via a combination operation; generating multiple common-centroid placements according to the unit element array and apply global routing assignment to each of the common-centroid placements, which is formed of multiple nets, each of the networks being formed of multiple unit elements; proceeding with cost evaluation in such a way that a cost calculation is applied to each of the common-centroid placements to get a corresponsive value, each of the values being used for evaluating the matching quality of each common-centroid placement and the induced parasitics resulting from the global routing assignment; and comparing all of the common-centroid placements according to the values got from the cost evaluation and selecting the common-centroid placement corresponding to one of the values according to a predetermined condition for further detailed routing.

BRIEF DESCRIPTION OF THE DRAWINGS

FIG. 1 is a schematic view of a preferred embodiment of the present invention, illustrating a topology of the unit element array.

FIG. 2 is another schematic view of the preferred embodiment of the present invention, illustrating a common-centroid placement.

DETAILED DESCRIPTION OF PREFERRED EMBODIMENTS

Figure 3:
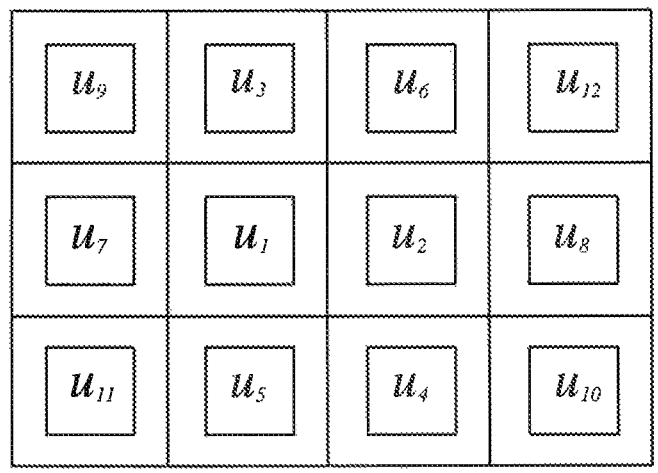
FIG. 3 is another schematic view of the preferred embodiment of the present invention, illustrating another common-centroid placement.
Figure 4:
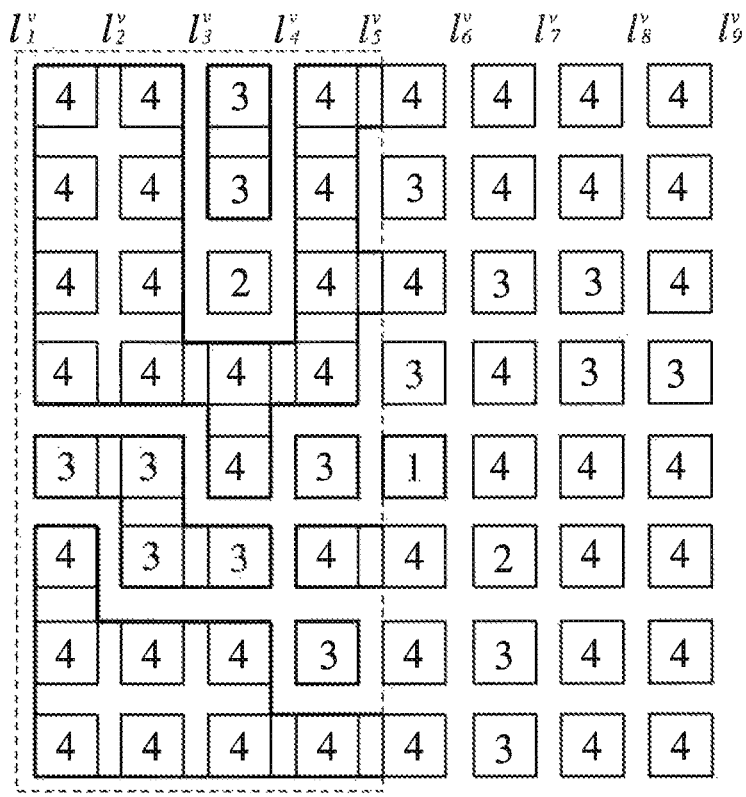
FIG. 4 is a schematic view of the preferred embodiment of the present invention, illustrating that the unit element array is grouped.

Structural features and desired effects of the present invention will become more fully understood by reference to a preferred embodiment given hereunder. However, it is to be understood that these embodiments is given by way of illustration only, thus is not limitative of the claim scope of the present invention.

Figures 1, 2:
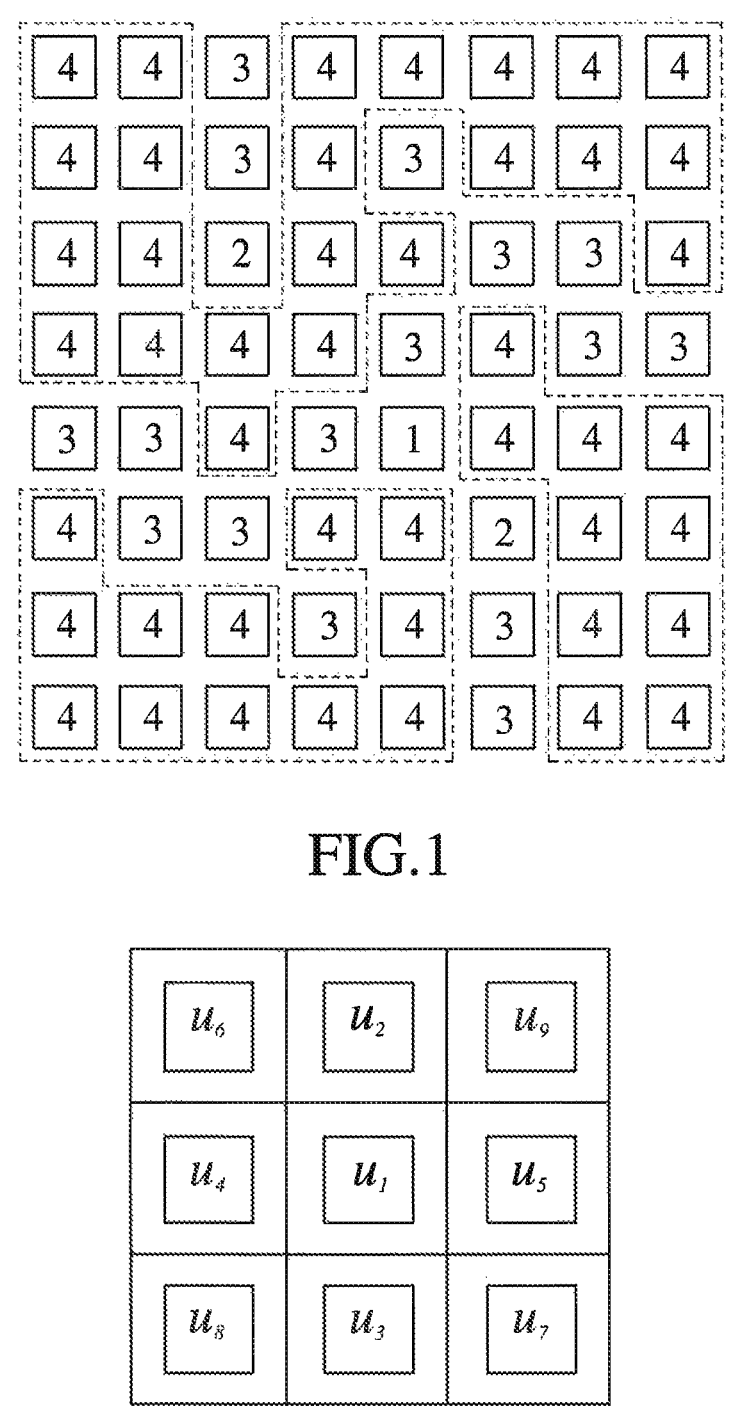

Referring to FIGS. 1-6, a method of common-centroid IC layout generation in accordance with a preferred embodiment of the present invention includes the following steps.

Step 1: Acquire a netlist (not shown) of one circuit-element set. The netlist at least includes the number of unit element corresponding to each element of the circuit-element set.

Step 2: Sum up the numbers of the unit elements of all elements of the circuit-element set to get the total number of the unit elements and determine a unit element array, the aspect ratio of which is closes to 1, by an algorithm.

The aforesaid algorithm is based on the following two equations:

$$r_1 = \left\lceil \sqrt{\sum_{i=1}^{m} k_i} \right\rceil ; s_1 = \left\lceil \frac{\sum_{i=1}^{m} k_i}{r_1} \right\rceil \quad (1)$$

$$r_2 = r_1 + 1; s_2 = \left\lceil \frac{\sum_{i=1}^{m} k_i}{r_2} \right\rceil \quad (2)$$

where m denotes the total unit element number, $r_1$ and $s_1$ denote the height and width of the array $A_{r_1 \times s_1}$, respectively, r2 and s2 denote the height and width of the array $A_{r_2 \times s_2}$ respectively, and k denotes one single unit element.

The two arrays $A_{r_1 \times s_1}$ and $A_{r_2 \times s_2}$ can be calculated based on the aforesaid algorithm and which of the two arrays is the unit element array having the aspect ratio of 1 can be determined. In this preferred embodiment, the unit element array having the aspect ratio of 1 is the array $A_{8 \times 8}$ where r=8 and s=8 as an example shown in FIG. 1.

Step 3: Generate multiple common-centroid placements according to the unit element array and apply global routing assignment to each of the common-centroid placements. Each of the common-centroid placements is formed of multiple nets $n_i$. Each of the nets $n_i$ is formed of multiple unit elements. In terms of the array the unit element array $A_{8 \times 8}$ shown in FIG. 1, it includes four nets, which are the net $n_l$ formed of elements 1, the net $n_2$ formed of elements 2, the net $n_3$ formed of elements 3, and the net $n_4$ formed of elements 4, respectively.

The multiple common-centroid placements are generated based on a pair-sequence representation. Since the pair-sequence representation belongs to the prior art, referring to, for example, "Common-centroid capacitor placement considering systematic and random mismatches in analog integrated circuits." proposed by C.-W. Lin, J.-M. Lin, Y.-C. Chiu, C.-P. Huang, and S.-J. Chang and published at pp. 528-533 of *Proceedings of ACM/IEEE Design Automation Conference* on June 2011, so detailed recitation is skipped. As shown in FIG. 2, taking a 3×3 unit element array $A_{3×3}$ as an example, the array $A_{3×3}$ is converted from the pair sequence $P_{3×3}$= $[(u_1,), (u_2, u_3), (u_4, u_5), (u_6, u_7), (u_8, u_9)]$. As shown in FIG. 3, taking a 3×4 unit element array $A_3$, as an example, the array $A_{3×4}$ is converted from the pair sequence $P_{3×4}$=$[(u_1, u_2), (u_3, u_4), (u_5, u_6), (u_7, u_8), (u_9, u_{10}), (u_{11}, u_{12})]$.

Among the multiple common-centroid placements generated by the aforesaid unit element array $A_{8×3}$, all of the unit elements belong to the same net must be distributed connected and one-track routable.

The aforesaid placement style of distributed connected indicates that all of the unit elements belonging to the same net are unequally divided into a number of groups in which all unit elements form a connected placement and the connected placements of different groups are dispersively distributed all over the unit element array, in such a way that the connected placements are not adjacent to one another, and connected with one another via a plurality of routing tracks. Such placement requires at most (r/2) ((s/2)) horizontal (vertical) routing tracks. In terms of FIG. 1, the unit element 4 of the net 4 is divided into three groups, referring to the area surrounded by dotted lines indicated in FIG. 1.

Whether all of the unit elements belong to the same net are one-track routable is determined by a determination logic for one of the nets in the unit element array. The determination logic is to make each unit element form a disjoined subset and next to determine one by one whether the unit elements corresponding to different disjoined subsets are adjacent to one another. If the answer is positive, combine the disjoined subsets to which the adjacent unit elements correspond to form a new disjoined subset. After the combination, determine whether there are any other adjacent unit elements. If other adjacent unit elements are still available, combine the disjoined subsets to which these adjacent unit elements correspond to form a new disjoined subset. After the combination, determine whether there are any other adjacent unit elements. Combine them if they are available. Proceed with this step iteratively until none of any adjacent unit elements corresponding to different disjoined subsets is available. When none of any adjacent unit elements corresponding to different disjoined subsets is available, define the last disjoined subset as a set and then determine whether the next unit element which has not been determined is adjacent to another. After all of the unit elements are determined, the multiple disjoined sets can be combined together and the unit elements in each of the disjoined sets are connected with one another. At last, in these sets, locate a vertical or horizontal channel for connection with the sets and make it serve as a common channel. If the common channel is located, it will be determined that the common-centroid placement is one-track routable. The vertical channel indicates the channel between each two unit elements of the columns in the unit element array, and the horizontal channel indicates the channel between each two unit elements of the rows in the unit element array.

In this preferred embodiment, the unit element array shown in FIG. 1 is taken as an example and the subset combination is applied to all of the unit elements in the top half of the unit element array, namely $A_{8×4}$. The solid frame shown in FIG. 4 indicates each of the subsets after the combination. A vertical channel $L_4^V$ for connection with each set serves as the common channel and the top half of the unit element array can be determined to be one-track mutable.

Figure 5:
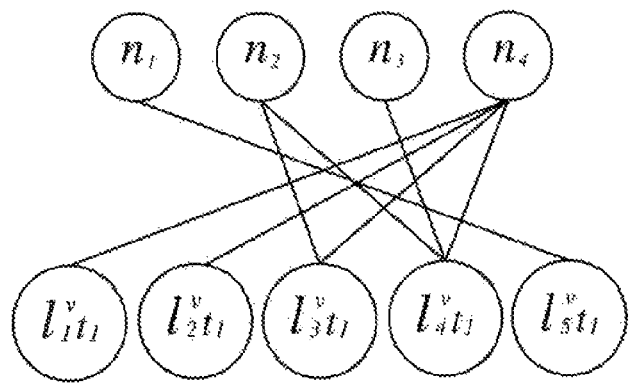
FIG. 5 illustrates a weighted bipartite graph in accordance with the preferred embodiment of the present invention.
Figure 6:
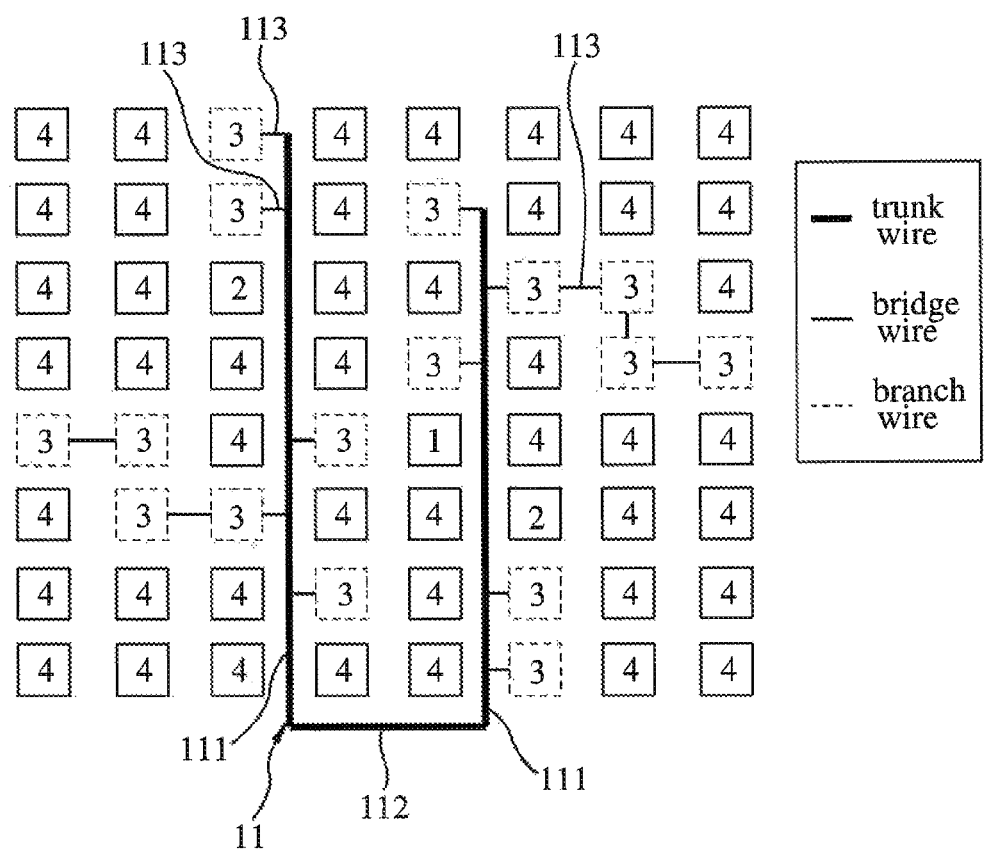
FIG. 6 is similar to FIG. 1, illustrating a routing topology of the unit element array.

As regards the aforesaid the global routing assignment, in this preferred embodiment, a minimum-weighted bipartite-matching is applied. Referring to FIG. 5 in view of FIG. 4, make all of the nets $n_1, n_2, n_3, n_4$ in the top half (e.g. or rxs/2 or rxs/2) of the unit element array serve as a vertex set and make the vertical tracks $l_1$'$t_l$, $l_2$'$t_l$, $l_3$'$t_l$, $l_4$'$t_l$, $l_5$'$t_l$ serve as an edge, so the available tracks can be located. According to the routing assignment of a weighted bipartite graph shown in FIG. 5, the available track $l_4$' of the net n3 in the top half of the unit element array can be located and then the available track of the net n3 in the bottom half of the unit element array can also be located in the same way, so the available track 11 shown in FIG. 6 can be generated. In this way, the trunk distance of the trunk 111, the bridge distance of the bridge wire 112, and the branch distance of the branch wire 113 can be acquired, respectively, and summed up to get the total routing wirelength. The trunk distance indicates the wirelength of the net $n_i$. The bridge distance indicates the wirelength of the net $n_i$ which connects the two trunks. The branch distance is the rest wirelength of the net $n_i$ which connects all of its associate unit elements.

Step 4: Perform cost evaluation by applying a cost calculation to each common-centroid placement to get a corresponsive value. These values can be used for evaluating matching quality of each common-centroid placement and the induced parasitics incurred by the global routing assignment.

While the cost evaluation proceeds, the calculation can be based on the following equation:

$$\Phi = \left( \alpha \times \frac{M - M_{avg}}{M_{avg}} + \beta \times \frac{\rho_{avg} - \rho}{\rho_{avg}} + \gamma \times \frac{W - W_{avg}}{W_{avg}} + (1 - \alpha - \beta - \gamma) \times \frac{W^P - W^P_{avg}}{W^P_{avg}} \right) \quad (4)$$

where M denotes induced mismatch resulting from oxide-gradient, which belongs the prior art, referring to "Automatic generation of common-centroid capacitor arrays with arbitrary capacitor ratio" proposed by D. Sayed and M. Dessouky and published in pp. 576-580 of *Proceedings of IEEE/ACM Design, Automation and Test in Europe Conference* in 2002, so detailed recitation is skipped; p denotes an overall correlation coefficient, which belong to the prior art, referring to "Impact of capacitance correlation on yield enhancement of mixed-signal/analog integrated circuits" proposed by P.-W. Luo, J.-E. Chen, C.-L. Wey, L.-C. Cheng, J.-J. Chen, and W.-C. Wu and published at pp. 2097-2101, no. 11, vol. 27 of *IEEE Trans. Computer-Aided Design* in November of 2008, so detailed recitation is skipped; W denotes the total routing wirelength; $W^P$ denotes the total wirelength parallel to the trunk; $\alpha$, $\beta$, and $\gamma$ are user-specified parameters and $0 \leq \alpha, \beta, \gamma \leq 1$; the subscript avg denotes the average of the corresponsive parameter; and $\Phi$ denotes resultant value of the cost evaluation. $W^P$ can be acquired by means of the minimum-weighted bipartite-matching while the aforesaid global routing assignment proceeds.

Step 5: Compare the values acquired from all of the common-centroid placements according to the cost evaluation and select the common-centroid placement to which one of the values corresponds according to a predetermined condition for detailed routing assignment. When the comparison proceeds, the predetermined condition is the minimum value.

The detailed routing assignment includes the steps of arranging the trunks from left to right on the channel between the columns or rows of the unit elements in the unit element array of the selected common-centroid placement. Besides, while the trunk wires are arranged, the three-layer horizontal-vertical-horizontal (HVH) routing model or the three-layer vertical-horizontal-vertical (VHV) routing model is used for decreasing the occurrence of parallel problem of the trunk wires between different layers, which belong to the prior art, referring to "Three-Layer channel routing" proposed by Y. K. Chen and M. L. Liu and published at pp. 156-163, no. 2, vol. 3 of *IEEE Trans. Computer-Aided Design* in April of 1984, so detailed recitation is skipped; next the branch wire is arranged; and finally the bridge wire is arranged.

The aforesaid global routing assignment and detailed routing assignment can be completed on a computer system.

The method based on the aforesaid steps can determine the unit element array of one circuit-element set, then generate multiple common-centroid placements based on the unit element array, and finally apply the global routing assignment to each common-centroid placement.

In light of the above, a common-centroid chip layout can be completed. It can effectively make the routing wirelength be the shortest to further reduce the capacitive layout area and to decrease the induced parasitics. Besides, the best matching quality can be reached to further maintain the accuracy of the capacitance ratios after the routing of each unit element is completed.

What is claimed is:

1. A non-transitory computer-readable medium containing instructions, which when read and executed by a computer, cause the computer to execute a method of common-centroid IC layout, wherein the method comprises steps of:

acquiring a netlist of an circuit-element set, the netlist at least containing the number of unit element corresponding to each element of the circuit-element set;

summing up the numbers of the unit elements of all elements of the circuit-element set to get the total number of the unit elements and, based on said total number of the unit elements, determining a unit element array, having an aspect ratio closest to 1 by an algorithm, the aspect ratio being a ratio of the number of the unit elements at a column of the unit element array to the number of the unit elements at a row of the unit element array;

generating multiple common-centroid placements according to the umnnlement array and applying global routing assignment to each of the common-centroid placements where each of the common-centroid placements is formed of multiple nets, each of which is formed of multiple unit element;

performing cost evaluation by applying a cost calculation to each common-centroid placement to get a corresponsive value, which can be used for evaluating matching quality of each common-centroid placement and the induced parasitics incurred by the global routing assignment; and comparing the values acquired from all of the common-centroid placements according to the cost evaluation and select the common-centroid placement to which one of the values corresponds according to a predetermined condition for detailed routing assignment.

2. The non-transitory computer-readable medium as defined in claim 1, wherein the algorithm is based on the following two equations:

$$r_1 = \left\lceil \sqrt{\sum_{i=1}^{m} k_i} \right\rceil; s_1 = \left\lceil \frac{\sum_{i=1}^{m} k_i}{r_1} \right\rceil \quad (1)$$

$$r_2 = r_1 + 1; s_2 = \left\lceil \frac{\sum_{i=1}^{m} k_i}{r_2} \right\rceil \quad (2)$$

where m denotes the total unit element number, $r_1$ and $s_1$ denote the height and width of the array $A_{r_1 \times s_1}$ respectively, $r_2$ and $s_2$ denote the height and width of the array $A_{r_2 \times s_2}$ respectively, and k denotes one single unit element;

wherein the two arrays $A_{r_1 \times s_1}$ and $A_{r_2 \times s_2}$ are calculated based on the aforesaid algorithm and which of the two arrays is the unit element array having the aspect ratio of 1 can be determined.

3. The non-transitory computer-readable medium as defined in claim 1, wherein the multiple common-centroid placements are generated based on a pair-sequence representation.

4. The non-transitory computer-readable medium as defined in claim 1, wherein among the multiple common-centroid placements generated by the aforesaid unit element array, all of the unit elements belong to the same net must be distributed connected and one-track routable.

5. The non-transitory computer-readable medium as defined in claim 4, wherein the placement style of distributed connected indicates that all of the unit elements belonging to the same net are unequally divided into a number of groups in which all unit elements form a connected placement and the connected placements of different groups are dispersively distributed all over the unit element array, in such a way that the connected placements are not adjacent to one another, and connected with one another via a plurality of routing tracks, such placement requires at most r/2 (s/2) horizontal (vertical) routing tracks.

6. The non-transitory computer-readable medium as defined in claim 4, wherein whether all of the unit elements belong to the same net are one-track routable is determined by a determination logic for one of the nets in the unit element array, the determination logic being adapted to make each unit element form a disjoined subset and next to determine one by one whether the unit elements corresponding to different disjoined subsets are adjacent to one another; if the answer is positive, combine the disjoined subsets to which the adjacent unit elements correspond to form a new disjoined subset; after the combination, determine whether there are any other adjacent unit elements; if other adjacent unit elements are still available, combine the disjoined subsets; after the combination, determine whether there are any other adjacent unit elements; combine them if they are available; proceed with this step iteratively until none of any adjacent unit elements corresponding to different disjoined subsets is available; when none of any adjacent unit elements corresponding to different disjoined subsets is available, define the last disjoined subset as a set and then determine whether the next unit element which has not been determined is adjacent to another; after all of the unit elements are determined, the multiple disjoined sets can be combined together and the unit elements in each of the disjoined sets are connected with one another; at last, in these sets, locate a vertical or horizontal channel for connection with the sets and make it serve as a common channel; if the common channel is located, it will be determined that the common-centroid placement is one-track routable, the vertical channel indicating the channel between each two unit elements of the columns in the unit element array, the horizontal channel indicating the channel between each two unit elements of the rows in the unit element array.

7. The non-transitory computer-readable medium as defined in claim 1, wherein the global routing assignment is based on a minimum-weighted bipartite-matching whereby the trunk distance of the trunk, the bridge distance of the bridge wire, and the branch distance of the branch wire are acquired, respectively, and summed up to get the total routing wirelength.

8. The non-transitory computer-readable medium as defined in claim 1, wherein the calculation is based on the following equation:

$$\Phi = \left( \alpha \times \frac{M - M_{avg}}{M_{avg}} + \beta \times \frac{\rho_{avg} - \rho}{\rho_{avg}} + \gamma \times \frac{W - W_{avg}}{W_{avg}} + (1 - \alpha - \beta - \gamma) \times \frac{W^P - W^P_{avg}}{W^P_{avg}} \right) \quad (4)$$

where M denotes induced mismatch resulting from oxide-gradient, p denotes an overall correlation coefficient, W denotes the total routing wirelength, $W^P$ denotes the total wirelength parallel to the trunk, $\alpha$, $\beta$, and $\gamma$ are user-specified parameters and $0 \leq \alpha, \beta, \gamma \leq 1$, the subscript avg denotes the average of the corresponsive parameter, and $\Phi$ denotes resultant value of the cost evaluation.

9. The non-transitory computer-readable medium as defined in claim 1, wherein when the comparison proceeds, the predetermined condition is the minimum value.

10. The non-transitory computer-readable medium as defined in claim 1, wherein The detailed routing assignment includes the steps of arranging the trunks from left to right on the channel between the columns or rows of the unit elements in the unit element array of the selected common-centroid placement; while the trunk wires are arranged, the three-layer horizontal-vertical-horizontal or vertical-horizontal-vertical routing model is used for decreasing the occurrence of parallel problem of the trunk wires between different layers; next the branch wire is arranged; and finally the bridge wire is arranged.

* * * * *